United States Patent
Taylor et al.

(10) Patent No.: US 6,749,986 B2
(45) Date of Patent: Jun. 15, 2004

(54) POLYMERS AND PHOTORESIST COMPOSITIONS FOR SHORT WAVELENGTH IMAGING

(75) Inventors: Gary N. Taylor, Northboro, MA (US); Charles R. Szmanda, Westborough, MA (US)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

(21) Appl. No.: 09/948,459

(22) Filed: Sep. 8, 2001

(65) Prior Publication Data

US 2002/0055060 A1 May 9, 2002

Related U.S. Application Data

(60) Provisional application No. 60/252,662, filed on Nov. 22, 2000, and provisional application No. 60/231,046, filed on Sep. 8, 2000.

(51) Int. Cl.$^7$ ............................................. G03F 7/004
(52) U.S. Cl. .................... 430/270.1; 430/326; 430/906; 430/907
(58) Field of Search ........................... 430/270.1, 326, 430/906, 907

(56) References Cited

U.S. PATENT DOCUMENTS 5,187,048 A * 2/1993 Woods et al. ................ 430/286
6,013,413 A * 1/2000 Frechet et al. ........... 430/270.1
6,468,712 B1 * 10/2002 Fedynysyn ............... 430/270.1

OTHER PUBLICATIONS

Ahn, K–D, et al, Polymer, 1992 33(22) 4851–4856.*

* cited by examiner

*Primary Examiner*—Rosemary Ashton
(74) *Attorney, Agent, or Firm*—Peter F. Corless; Darryl P. Frickey; Edwards & Angell, LLP

(57) ABSTRACT

The present invention includes new polymers and use of such polymers as a resin component for photoresist compositions, particularly chemically-amplified positive-acting photoresist compositions. Polymers and resists of the invention are particularly useful for imaging with short wavelength radiation, such as sub-200 nm and preferably about 157 nm. Polymers of the invention contain one or more groups alpha to an acidic site that are substituted by one or more electron-withdrawing groups.

15 Claims, No Drawings

POLYMERS AND PHOTORESIST COMPOSITIONS FOR SHORT WAVELENGTH IMAGING

This application claims the benefit of U.S. Provisional Application(s) No(s).: Application No. 60/231,046 filing date Sep. 8, 2000 Applicatin No. 60/252,662 filing date Nov. 22, 2000.

BACKGROUND OF THE INVENTION

1. Field of the Invention

The present invention includes new polymers and use of such polymers as a resin component for photoresist compositions, particularly chemically-amplified positive-acting photoresist compositions. Polymers and resists of the invention are particularly useful for imaging with short wavelength radiation, such as sub-200 nm and preferably about 157 nm. Polymers of the invention contain photoacid-labile groups that are substituted by one or more electron-withdrawing groups, and more particularly, where groups alpha to an acidic site are substituted by one or more electron-withdrawing groups.

2. Background

Photoresists are photosensitive films used for transfer of images to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photoinduced chemical transformation of the photoresist coating to thereby transfer the pattern of the photomask to the photoresist-coated substrate. Following exposure, the photoresist is developed to provide a relief image that permits selective processing of a substrate.

A photoresist can be either positive-acting or negative-acting. For most negative-acting photoresists, those coating layer portions that are exposed to activating radiation polymerize or crosslink in a reaction between a photoactive compound and polymerizable reagents of the photoresist composition. Consequently, the exposed coating portions are rendered less soluble in a developer solution than unexposed portions. For a positive-acting photoresist, exposed portions are rendered more soluble in a developer solution while areas not exposed remain comparatively less developer soluble. Photoresist compositions are described in Deforest, Photoresist Materials and Processes, McGraw Hill Book Company, New York, ch. 2, 1975 and by Moreau, Semiconductor Lithography, Principles, Practices and Materials, Plenum Press, New York, ch. 2 and 4.

While currently available photoresists are suitable for many applications, current resists also can exhibit significant shortcomings, particularly in high performance applications such as formation of highly resolved sub-half micron and sub-quarter micron features.

Consequently, interest has increased in photoresists that can be photoimaged with short wavelength radiation, including exposure radiation of about 250 nm or less, or even about 200 nm or less, such as wavelengths of about 193 nm. Use of such short exposure wavelengths can enable formation of smaller features. Accordingly, a photoresist that yields well-resolved images upon 248 nm or 193 nm exposure could enable formation of extremely small (e.g. sub-0.25 m) features that respond to constant industry demands for smaller dimension circuit patterns, e.g. to provide greater circuit density and enhanced device performance.

Recently, use of an $F_2$ excimer laser imaging source which provides radiation having a wavelength of about 157 nm, has been considered as a route to manufacture of even smaller features. See, generally, Kunz et al., SPIE Proceedings (Advances in Resist Technology), vol. 3678, pages 13–23 (1999).

SUMMARY OF THE INVENTION

The invention provides new resins that comprise one or more groups alpha to an acidic site (e.g. an alcohol, an amine or a hydroxyl amine) that are substituted by one or more electron-withdrawing groups. References herein that electronegative groups are "alpha" to an acidic site means that the electronegative groups are substituents of atoms (typically carbon) that are immediately adjacent to and covalently bonded to an acidic group such as alcohol (>COH), amine (e.g. >NH), or hydroxylamine (e.g. >NOH).

Resins of the invention preferably also comprise a substituted photoacid-labile deblocking group such as an ether, acetal, ketal, formal ($H_2CO$—), triethers, tetrathers, esters and other deblocking group. Those deblocking groups may comprise and linked the acidic site (e.g. alcohol, amine hydroxylamine), i.e. the acidic site will be present in a protected or in "latent acid form" as part of the deblocking group, where the deblocking group is cleaved in the presence of photoacid to provide the acidic group. For example, an alcohol or hydroxyl amine can be reacted with a vinyl ether such as ethyl vinyl ether to provide an acetal group, which will undergo a cleavage reaction in the presence of photogenerated acid.

Preferably, the acidic-group containing substituent is linked by multiple single bonds or "tethers" to the polymer backbone, e.g. 2 or 3 separate single bond linkages. Such multiple bond linkages can increase plasma stability as a plurality of bonds must be broken before a volatile fragment is released.

Specifically preferred acidic groups of polymers of the invention include those of the following Formulae (I), (IA) and (IB):

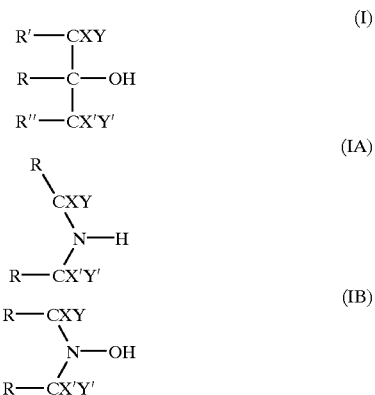

wherein in Formula (I), R, R' and R" are each independently hydrogen, a functional group for attachment to a polymer, e.g. carboxy, alcohol, alkyl e.g. $C_{1-6}$ alkyl, a chemical bond, and the like; or other non-hydrogen substituent such as an electron-withdrawing group such as those groups identified below for X and Y, an alkyl group such as $C_{1-6}$alkyl, alkoxy such as $C_{1-6}$alkoxy, and the like, with at least one of R, R' and R" being a functional group for attachment to a polymer, and preferably two or each of R, R' and R" are functional groups for attachment to a polymer;

at least one of X and Y, and preferably both of X and Y, are electron-withdrawing groups such as halogen (preferably fluorine, cyano, haloalkyl such as haloC$_{1-12}$alkyl particularly fluoroalkyl such as —CF$_3$ and other C$_{1-8}$perfluoroalkyl, and the like; and at least one of X' and Y', and preferably both of X' and Y', are electron-withdrawing groups such as halogen preferably fluoro, cyano, haloalkyl and the like. If one of X, Y, X' and/or Y' are not an electron-withdrawing group, then suitably they may be hydrogen, alkyl such as C$_{1-6}$alkyl, alkoxy preferably C$_{1-6}$alkoxy, and the like. Preferably at least one or both of X and Y is fluoro, and preferably at least one or both of X' and Y' is fluorine.

and wherein in Formula (IA) above each R is independently selected from the same group as defined for R, R' and R" in Formula (I) above;

and X, Y, X', and Y' are the same as defined for the same substituents in Formula (I) above. In Formula (IA) above, preferably at least one or both of X and Y is fluorine, and preferably at least one or both of X' and Y' is fluorine.

and wherein in Formula (IB) above each R is independently selected from the same group as defined for R, R' and R" in Formula (I) above;

and X, Y, X', and Y' are the same as defined for the same substituents in Formula (I) above. In Formula (IB) above, preferably at least one or both of X and Y is fluorine, and preferably at least one or both of X' and Y' is fluorine.

Polymers of the invention may contain a variety of groups. For example, polymers of the invention suitably may contain polymerized cyclic olefin units such as optionally substituted norbornene units; acrylate groups (which includes methacrylate groups herein) such as methyl methacrylate, ethyl methacrylate and other alkyl acrylates, and the like; cyano groups such as provided by polymerization with acrylonitrile or methacrylonitrile; and the like.

Polymers of the invention also may contain a variety of aromatic groups, preferably substituted with one or more electron-withdrawing groups to reduce undesired absorbance of the short wavelength radiation such as 157 nm by the aromatic group. More particularly suitable are polymers that contain phenyl repeat units, which units have one or more electron-withdrawing ring substituents such as halogen particularly fluorine, perhaloalkyl particularly perhaloC$_{1-8}$alkyl such as perfluoroC$_{1-8}$alkyl e.g. trifluoromethyl and the like; cyano; etc.

Photoresists of the invention in general comprise a polymer of the invention as discussed above and a photoactive component. Generally preferred resists of the invention are deblocking positive systems, often referred to as chemically amplified resists where photogenerated acid induces a chemical reaction of one or more components of the resist. Typically preferred is when the resin contains photoacid-labile groups, e.g. a photoacid-labile ester where acid deblocks the ester to provide a polar hydroxy or amine or other group in exposed regions of the resist coating layer.

The invention also includes methods for forming relief images, including methods for forming a highly resolved relief image such as a pattern of lines where each line has essentially vertical sidewalls and a line width of about 0.40 microns or less, or even about 0.25, 0.20. 01.5 or 0.10 microns or less. The invention further provides articles of manufacture comprising substrates such as a microelectronic wafer having coated thereon the photoresists and relief images of the invention. Other aspects of the invention are disclosed infra.

DETAILED DESCRIPTION OF THE INVENTION

As discussed above, the invention provides new polymers that exhibit reduced absorbance (i.e. greater transparency) to high energy radiation, such as radiation having a wavelength of less than 170 or 160 nm, particularly 157 nm.

As discussed above, polymers of the invention contain groups alpha to an acidic site (e.g. an alcohol, amine or hydroxyl amine) are substituted by one or more electron-withdrawing groups. Prior to exposure to photogenerated acid, the acidic site is preferably in a latent form, as a component of a photoacid-labile deblocking group.

Preferably, the acidic-group containing substituent is linked by multiple single bonds or "tethers" to the polymer backbone, e.g. 2 or 3 separate single bond linkages. Such multiple bond linkages can increase plasma stability as multiple bonds must be broken before a volatile fragment is released.

Illustrative polymers of the invention include the following 1, 2, 3, 4, 5 and 6:

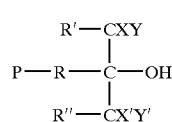

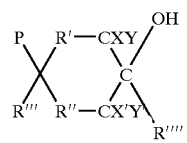

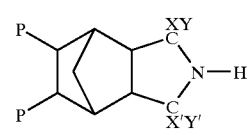

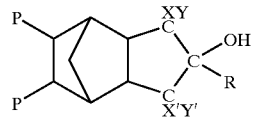

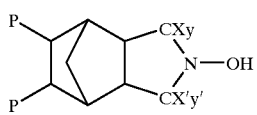

wherein in those structures 1, 2, 3, 4, 5 and 6, the R, R', R", X, Y, X' and Y' are the same as defined in Formulae (I), (IA) and (IB) above, R'" and R"" are the same as defined for R, R', and R" and P represents the polymer backbone structure.

Polymers of the invention may be homopolymers, or more typically are copolymers that contain two or more distinct repeat units, generally two, three, or four distinct repeat units. Polymers that have two or three distinct repeat units are particularly preferred.

Preferred polymers will have a relatively low absorbance of 157 nm radiation. For example, fluorinated polymers will be preferred, i.e. polymers that contain repeat units having fluorine or other fluorinated moieties such as —CF$_3$.

Polymers of the invention may be substantially free of aromatic groups. More particularly, preferred polymers that are substantially free of aromatic groups contain less than about 5 mole percent aromatic groups, more preferably less than about 1 or 2 mole percent aromatic groups, more preferably less than about 0.1, 0.08, 0.04 and 0.02 mole percent aromatic groups and still more preferably less than about 0.01 mole percent aromatic groups. Particularly preferred polymers are completely free of aromatic groups. Aromatic groups can be highly absorbing of sub-200 nm radiation and thus can be undesirable for polymers used in photoresists imaged with such short wavelength radiation.

Suitable polymers that are substantially or completely free of aromatic groups suitably contain fused non-aromatic alicyclic groups such as may be provided by polymerization of a norbornene compound or other alicyclic compound having an exocyclic carbon-carbon double bond.

It also has been found that polymers of the invention may contain aromatic groups that will not exhibit excessive absorbance of short wavelength exposure radiation, such as sub-170 nm or sub-160 nm radiation, particularly 157 nm exposure radiation. As discussed above, such aromatic groups preferably have one or more ring substituents that are electron-withdrawing groups, e.g. halogen particularly fluorine; or perfluoroalkyl such as trifluoromethyl.

Some polymers of the invention can be prepared by free radical polymerization, e.g., by reaction of a plurality of monomers to provide the various units as discussed above in the presence of a radical initiator under an inert atmosphere (e.g., $N_2$ or argon) and at elevated temperatures such as about 70° C. or greater, although reaction temperatures may vary depending on the reactivity of the particular reagents employed and the boiling point of the reaction solvent (if a solvent is employed). Suitable reaction temperatures for any particular system can be readily determined empirically by those skilled in the art.

Polymers of the invention also may be prepared by acid-promoted reaction of vinyl monomers containing appropriate moieties, such as groups of Formula (I), (IA) and/or (IB).

Appropriate monomers can be prepared by known synthetic reactions. For instance, a diketone with interposed alcohol (>COH) can be fluorinated, followed by a Diels-Alder reaction with cyclopentadiene, with the product then reacted with a reactive group of a polymer to provide a material of Formula (I) above, as exemplified by the following Scheme I:

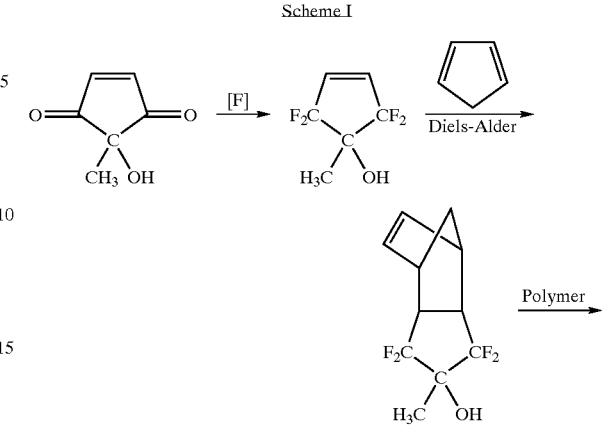

Scheme I

A similar reaction scheme can be employed with an acyclic reagent, as exemplified in the following Scheme II which entails a Grignard reaction, followed by Diels-Alder reaction, which then can be reacted with a polymer to provide a material of Formula (I) above.

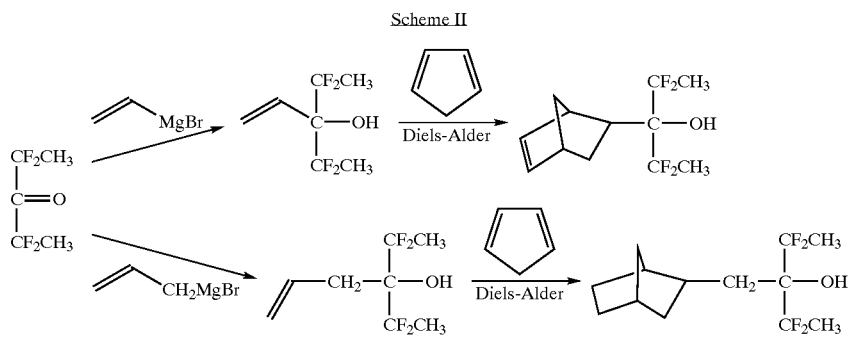

Scheme II

Acidic groups (e.g. groups of Formulae (I), (IA) and/or (IB) above) may be linked to polymer backbone groups by a variety of functional groups, e.g. esters, ethers, amides, etc.

As also discussed above, the acidic groups of polymers of the invention (e.g. alcohol, amine, hydroxyl amine) may be present in latent form, as a component of a photoacid-labile deblocking group. Preferred deblocking groups are acetal and ketal groups, which may be readily provided by reaction of the polymer containing acidic sites with appropriate vinyl ether compound such as ethylvinyl ether, t-butylvinyl ether, vinyl-2-hexyl ether and the like. Other preferred deblocking groups include formal grouos (-, triethers and tetraethers. See also Example 1 which follows for preparation of a preferred polymer with photoacid labile deblocking groups.

Preferably a polymer of the invention will have a weight average molecular weight ($M_w$) of 1,000 to about 100,000, more preferably about 2,000 to about 30,000 with a molecular weight distribution ($M_w/M_n$) of about 3 or less, more preferably a molecular weight distribution of about 2 or less. Molecular weights (either $M_w$ or $M_n$) of the polymers of the invention are suitably determined by gel permeation chromatography.

As discussed above, the polymers of the invention are highly useful as the resin binder component in photoresist compositions, particularly chemically-amplified positive resists. In suitable chemically-amplified positive resists of the invention, acidic sites such as alcohol, amine or hydroxylamine are wholly or partially blocked with acid sensitive groups such as ethers, acetals, ketal, triethers, tetraethers, esters and the like. For instance, an acetal group can be provided by reacting an alcohol or hydroxylamine with a vinyl ether such as ethyl vinyl ether and the like.

Photoresists of the invention in general comprise a photoactive component and a resin binder component that comprises a polymer as disclosed herein.

The resin binder component preferably is used in an amount sufficient to render a coating layer of the resist developable with an aqueous alkaline developer.

The resist compositions of the invention also comprise a photoacid generator (i.e. "PAG") that is suitably employed in an amount sufficient to generate a latent image in a coating layer of the resist upon exposure to activating radiation.

PAGs that generate strong photoacid are preferred. Generally preferred are onium salts PAGs, particularly sulfonium and iodonium PAGs, preferably with a sulfonate or carboxylate counter anion. Sulfonate salts are generally preferred, particularly such salts that generate a strong acid upon photoactivation, such as a perfluoroalkylsulfonic acid. For instance, preferred sulfonate PAGs include the following:

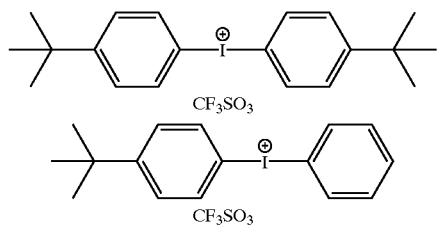

Other known PAGs also can be employed. For instance, see PAGs reported in *J. of Photopolymer Science and Technology*, 4(3):337–340 (1991) and U.S. Pat. No. 5,344,742.

A preferred optional additive is an added base, such as particularly tetrabutylammonium hydroxide (TBAH), or a TBAH salts, which can enhance resolution of a developed resist relief image. The added base is suitably used in relatively small amounts, e.g. about 0.1 to 3 percent by weight relative to the photoactive component (PAG).

Photoresists of the invention also may contain other optional materials. For example, other optional additives include anti-striation agents, plasticizers, speed all enhancers, etc. Such optional additives typically will be present in minor concentration in a photoresist composition except for fillers and dyes which may be present in relatively large concentrations such as, e.g., in amounts of from about 5 to 30 percent by weight of the total weight of a resist's dry components.

Photoresists of the invention can be readily prepared. For example, a resist of the invention can be prepared as a coating composition by dissolving the components of the photoresist (e.g., the resin and a PAG) in a suitable solvent such as, e.g., a glycol ether such as 2-methoxyethyl ether (diglyme); lactates such as ethyl lactate or methyl lactate, with ethyl lactate being preferred; proponiates, particularly methyl propionate, ethyl propionate, propylene glycol methylene acetate, and ethyl ethoxy propionate; or a ketone such as methylethyl ketone, cyclohexanone and 2-heptanone. Ethyl lactate and 2-heptanone are generally preferred. Typically the solids content of the photoresist varies between 3 and 15 percent by weight of the total weight of the photoresist composition.

The photoresists of the invention can be used in accordance with known procedures. Though the photoresists of the invention may be applied as a dry film, they are preferably applied on a substrate as a liquid coating composition, dried by heating to remove solvent preferably until the coating layer is tack free, exposed through a photomask to activating radiation such as 157 nm or other short wavelength radiation, optionally post-exposure baked to create or enhance solubility differences between exposed and nonexposed regions of the resist coating layer, and then developed preferably with an aqueous alkaline developer to form a relief image. Following development of the photoresist coating over the substrate, the developed substrate may be selectively processed on those areas bared of resist, e.g. by chemically etching or plating substrate areas bared or resist in accordance with known procedures. For the manufacture of microelectronic substrates, e.g. the manufacture of silicon dioxide wafers, suitable etchants include a gas etchant, e.g. a chlorine or fluorine-based etchant such as a $CF_4$ or $CF_4/CHF_3$ etchant applied as a plasma stream.

All documents disclosed herein are incorporated herein by reference.

EXAMPLE 1

Polymer Synthesis

One equivalent of 2,2,5,5-tetrafluoro-1-methylcyclopent-3-ene-1-ol, which is prepared by reaction of diethylaminosulfurictrifluoride with 1-hydroxy-1-methylcyclopent-3-ene-2,5-dione, is reacted with cyclopentadiene in diethyleneglycol dimethyl ether at about 100° C. for about 4 hours. Cooling can provide solid precipitate Which formation can be promoted by addition of isopropanol. The resulting norbornene tricyclic tetrafluoroalcohol is isolated by filtration, rinsing and drying. The norbornene alcohol is polymerized using an allyl platinium chloride catalyst in methylene chloride solvent and heating at reflux. The polymer is isolated by precipitation into a methanol-water mixture, rinsing with methanol and drying. The resulting polymer is reacted with chloromethyl-(2-ethoxyethyl ether) for extended period (3 hours) in tetrahydrofuran at reflux in the presence of molar excess (1.1 equivalents preferred) of triethylamine to convert a portion of the alcohol sites to blocked formal sites. The polymer is purified by precipitation into hexane, filtration to remove the polymer, rinsing with hexane and then 1:1 v:v mixture of hexane and methanol and drying.

EXAMPLE 2

Photoresist Preparation and Lithographic Processing

A photoresist of the invention is prepared by mixing the following components with amounts expressed as weight percent based on total weight of the resist composition:

| Resist components | Amount (wt. %) |
| --- | --- |
| Resin binder (polymer of Example 1) | 5 |
| Photoacid generator (bis-di-t-butylphenyl iodonium triflate) | 3 |
| Base additive (tetrabutylammonium hydroxide) | 0.4 |
| Solvent (cyclohexanone) | 91.6 |

As indicated immediately above, the resin binder of the resist is the polymer of Example 1 above. The photoacid generator is bis-di-t-butylphenyl iodonium triflate. The base additive is tetrabutyl ammonium hydroxide. The solvent is cyclohexaone.

The formulated resist composition is spin coated onto HMDS vapor primed 8 inch silicon wafers and softbaked on a proximity hotplate at 130° C. for 60 seconds. The resist coating layer is exposed through a photomask at 157 nm, and then the exposed coating layers are post-exposure baked at 110° C. The coated wafers are then treated with aqueous alkaline solution (0.26N) to develop the imaged resist layer.

The foregoing description of the invention is merely illustrative thereof, and it is understood that variations and modifications can be effected without departing from the spirit or scope of the invention as set forth in the following claims.

What is claimed is:

1. A photoresist composition comprising:
    a photoactive component and a resin,
    the resin comprising a substituent that comprises an acidic moiety of a latent acidic moiety that is an amine or a hydroxy amine group,
    wherein one or more carbons alpha to the acidic moiety of the latent acidic moiety are substituted by one or more electron-withdrawing groups.

2. The photoresist composition of claim 1 wherein the substituent comprises an ether group, an acetal group, a ketal group, a formal group, a triether group or a tetraether group.

3. The photoresist composition of claim 1 wherein the substituent group is linked by multiple single bonds to the resin backbone.

4. The photoresist composition of claim 1 wherein the substituent group is linked by one single bond to the resin backbone.

5. The photoresist composition of claim 1 wherein the substituent corresponds to the following Formula (IA):

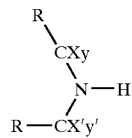

wherein each R is independently hydrogen or a non-hydrogen substituent, with at least one R linked to the resin;
    at least one of X and Y is an electron-withdrawing group, and at least one of X' and Y' is an electron withdrawing group.

6. The photoresist composition of claim 1 wherein the substituent corresponds to the following Formula (IB):

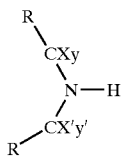

wherein each R is independently hydrogen or a non-hydrogen substituent, with at least one R linked to the resin;
    at least one of X and Y is an electron-withdrawing group, and at least one of X' and Y' is an electron withdrawing group.

7. The photoresist composition of claim 1 wherein the resin is at least substantially free of aromatic groups.

8. The photoresist composition of claim 1 wherein the resin comprises aromatic groups.

9. A photoresist composition comprising:
    a photoactive component and a resin,
    the resin comprising i) aromatic groups and ii) a substituent that comprises an acidic moiety of a latent acidic moiety and the substituent group linked by multiple single bonds to the resin backbone,
    wherein one or more carbons alpha to the acidic moiety of the latent acidic moiety are substituted by one or more electron-withdrawing groups.

10. The photoresist composition of claim 9 wherein the acidic moiety of latent acidic moiety is an lacohol group, an amine group or a hydroxyl amine group.

11. The photoresist composition of claim 9 wherein the substituent comprises an ether group, an acetal group, a ketal group, a formal group, a triether group or a tetraether group.

12. A method for forming a photoresist relief image comprising:
    (a) applying a coating layer of a photoresist composition of any one of claims 1 through 11 on a substrate; and
    (b) exposing the photoresist coating layer to patterned activating radiation and developing the exposed photoresist layer to provide a relief image.

13. The method of claim 12 wherein the photoresist layer is exposed to radiation having a wavelength of less than about 200 nm.

14. An article of manufacture having on at least one surface a coating layer of the photoresist composition of any one of claims 1 through 11.

15. The article of claim 14 wherein the article is a microelectronic wafer.

* * * * *